(12) United States Patent
Dubey (10) Patent No.: US 11,869,572 B2
(45) Date of Patent: Jan. 9, 2024

(54) POWERGATE BIASING TECHNIQUES FOR MEMORY APPLICATIONS

(71) Applicant: Arm Limited, Cambridge (GB)

(72) Inventor: Prashant Dubey, Sawston (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/516,094

(22) Filed: Jul. 18, 2019

(65) Prior Publication Data

US 2021/0020225 A1  Jan. 21, 2021

(51) Int. Cl.
*G11C 11/4074* (2006.01)
*G11C 5/05* (2006.01)
*G11C 5/14* (2006.01)
*G11C 11/56* (2006.01)

(52) U.S. Cl.
CPC ............ *G11C 11/4074* (2013.01); *G11C 5/05* (2013.01); *G11C 5/147* (2013.01); *G11C 11/5628* (2013.01)

(58) Field of Classification Search
None
See application file for complete search history.

(56) References Cited

U.S. PATENT DOCUMENTS

| | | | | |
|---|---|---|---|---|
| 4,979,145 A | * | 12/1990 | Remington | G11C 7/00 711/105 |
| 5,300,835 A | * | 4/1994 | Assar | H01L 27/11898 257/E27.11 |
| 5,734,604 A | * | 3/1998 | Akamatsu | G11C 11/417 365/210.12 |
| 2005/0128789 A1 | * | 6/2005 | Houston | G11C 29/028 365/154 |
| 2007/0096794 A1 | * | 5/2007 | Houston | H03K 19/0016 327/534 |
| 2010/0214863 A1 | * | 8/2010 | Chan | G11C 5/147 365/228 |
| 2010/0322016 A1 | * | 12/2010 | Kumar | G11C 7/02 365/189.07 |
| 2013/0148402 A1 | * | 6/2013 | Chang | G11C 8/08 365/63 |
| 2013/0290750 A1 | * | 10/2013 | Yang | G11C 8/08 713/320 |
| 2013/0290753 A1 | * | 10/2013 | Ramaraju | G06F 1/3275 713/320 |

* cited by examiner

*Primary Examiner* — J. H. Hur
(74) *Attorney, Agent, or Firm* — Pramudji Law Group PLLC; Ari Pramudji (57) ABSTRACT

Various implementations described herein are directed to device having a memory array that operates with an applied core voltage. The device includes a power gating switch that receives a core supply voltage and provides the applied core voltage to the memory array. The device includes a biasing stage that selectively activates the power gating switch based on sensing a changing voltage level of the applied core voltage.

19 Claims, 8 Drawing Sheets

POWERGATE BIASING TECHNIQUES FOR MEMORY APPLICATIONS

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, designers typically use highly complex compiler designs to reduce leakage in memory applications. Some of these memory designs use self-regulating techniques to maintain consistent voltages across a chip. Some of these memory designs also fail to utilize process, voltage and temperature (PVT) sensing when seeking to regulate voltage across core memory circuitry. Also, some of these memory designs use an analog reference voltage to assist with regulating core voltage which can increase costs and accuracy of conventional memory designs. Therefore, there exists a need to improve memory designs so as to reduce complexity and cost.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to central biased power gating header and/or footer schemes and techniques for retention mode leakage savings in memory circuitry, such as, e.g., static random access memory (SRAM) arrays. In some instance, various schemes and techniques described herein may provide for a header and/or footer retention mode that is centrally biased by a dummy array having a sufficient number of cells to replicate the leakage trend of the main array, i.e., track global variation in the main array leakage. In some instances, the dummy array may be biased by a diode of differing sizes that may be changed manually or through a process-voltage-temperature (PVT) sensor. In other instances, the dummy array may operate as a leakage sensor for biasing the header device and/or the footer device. Central biasing may be powerful, as central biasing provides architectural possibilities, such as, e.g., system level efficiency boosting for integration with SRAM. Also, depending on performance targets and the PVT corners, optimization may be achieved by providing various mechanisms for self-timing and/or self-tuning to adjust leakage power with respect to performance.

Various schemes and techniques described herein may provide for controlling gate voltage of a power-gating (PG) header device (and/or a PG footer device). In some instances, PG gate voltage may be self-adjusted so as to ensure that a retention voltage (VRET) is maintained across the PVT range. As described below, the PG header or footer device utilizes a central biasing technique with multiple cascaded common source diode load inverting amplifier stages. In this instance, the main array voltage (VDDC, or VSSC) is used as the biasing voltage for a central bias amplifier, and the central biasing amplifier generates a biasing voltage (VPGBIAS) that makes VDDC=VRET. Also, the PG header or footer device plus an array forms another inverting amplifier having an amplifying gain near VPGBIAS. Further, a closed loop may be formed by these amplifying stages. Thus, no external regulated voltage reference is used with the various schemes and techniques described herein, and the biasing voltage VPGBIAS may vary across PVT. However, in some instances, sensitivity to PVT variations may be reduced in the closed loop, and as such, higher loop gain may be an improvement over conventional practice.

Various schemes and techniques described herein may provide for maintaining regulation of memory array leakage current across PVT (i.e., process, voltage and temperature). This idea may be achieved by varying an applied core voltage (VDDC or VSSC) sympathetically (or selectively) with array leakage current. For instance, if temperature rises and array leakage increases, various schemes and techniques described herein may cause VDDC to reduce, thereby reducing array leakage current. This idea may be adapted to exploit a property associated with a higher array leakage current that is correlated with a lower retention voltage, wherein a reduced VDDC may be tolerated when array leakage increases. In some instances, this idea uses closed-loop control without an additional reference voltage, e.g., by exploiting a large intrinsic capacitance on VDDC (that may be augmented by a capacitor) so as to assure loop stability at design time, without using an additional reference voltage.

Various implementations of memory biasing techniques will be described in detail herein with reference to FIGS. 1A-3B.

Figure 1A:
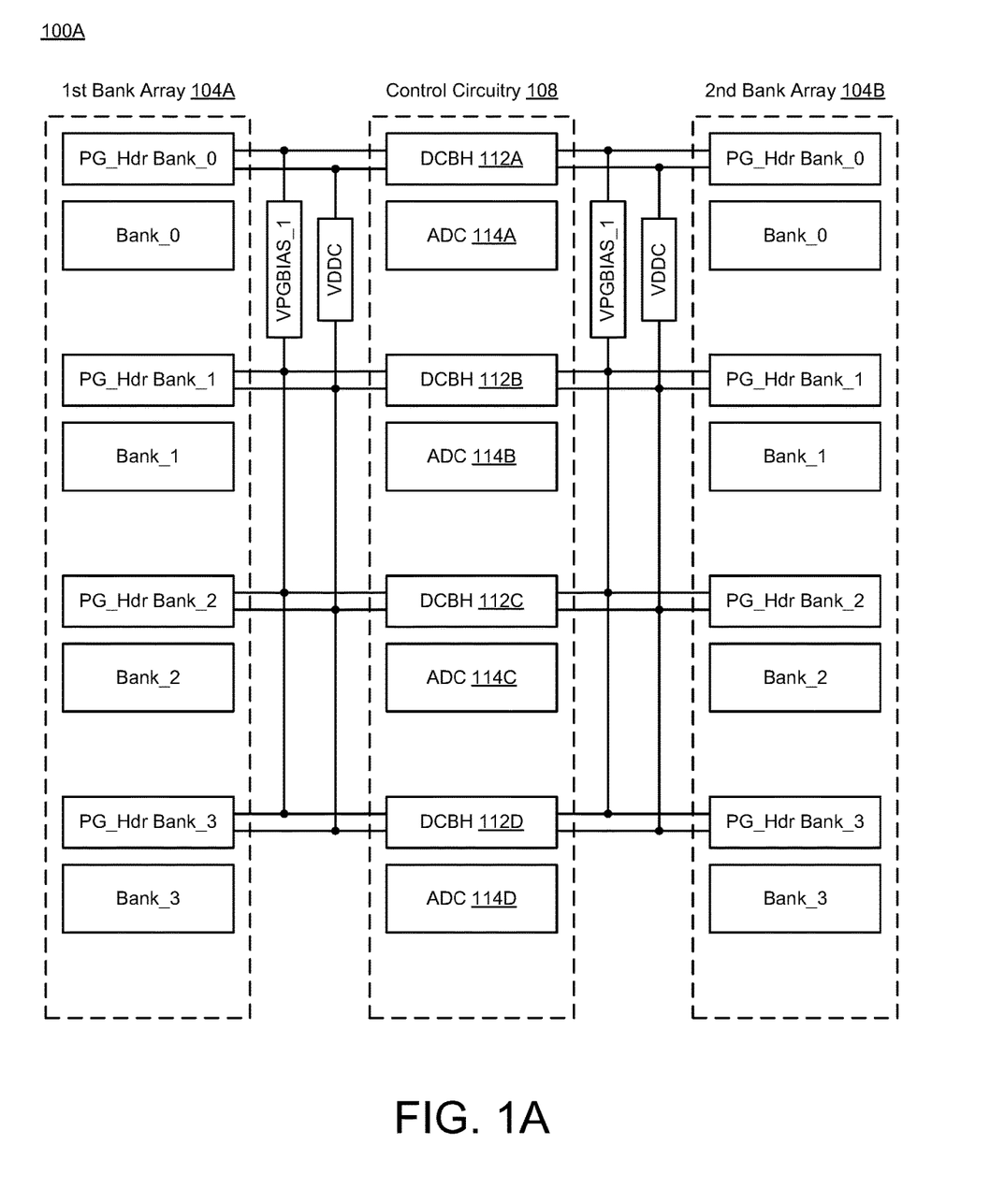
FIGS. 1A-1C illustrate various diagrams of memory circuitry in accordance with various implementations described herein.
Figure 1B:
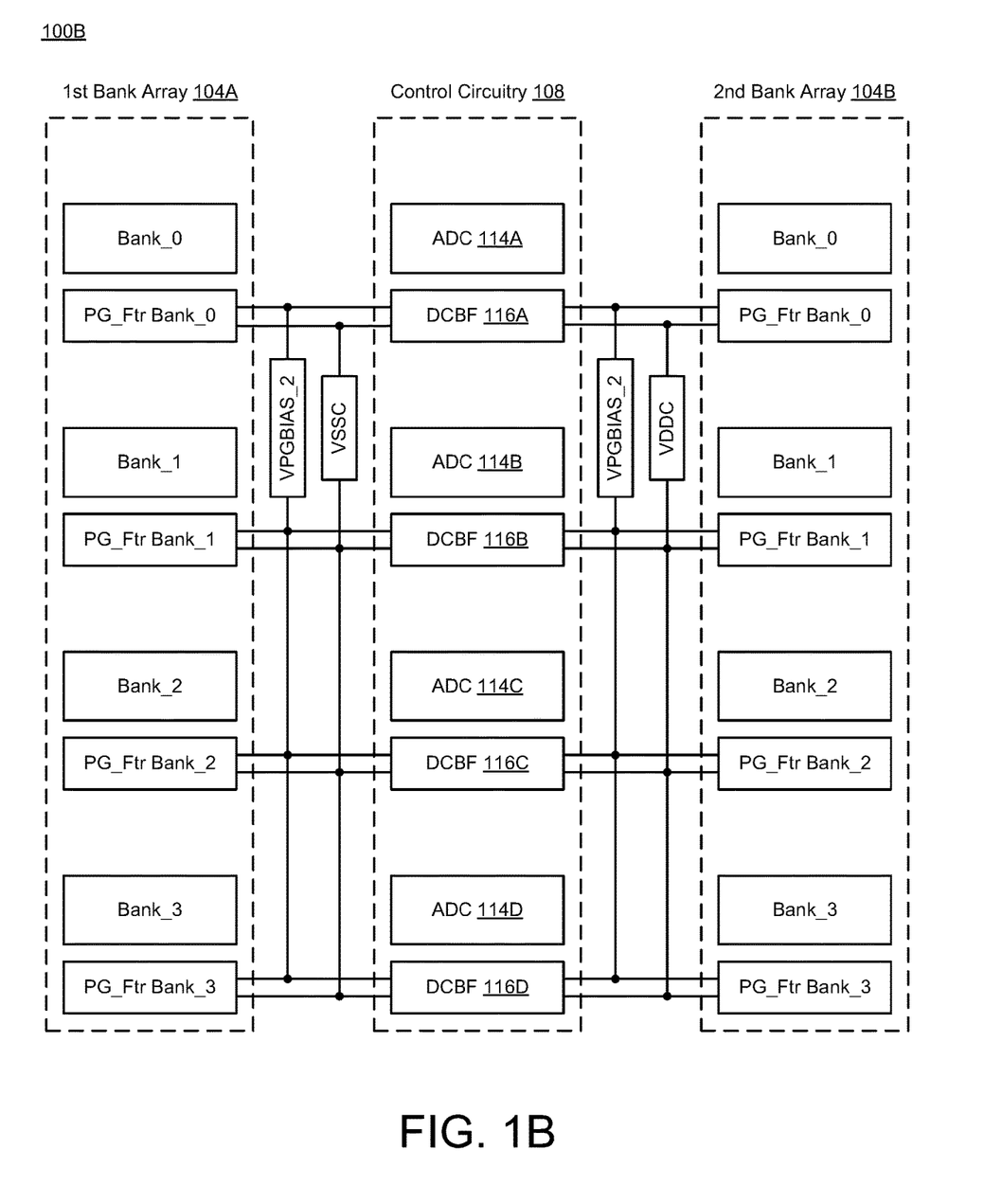
Figure 1C:
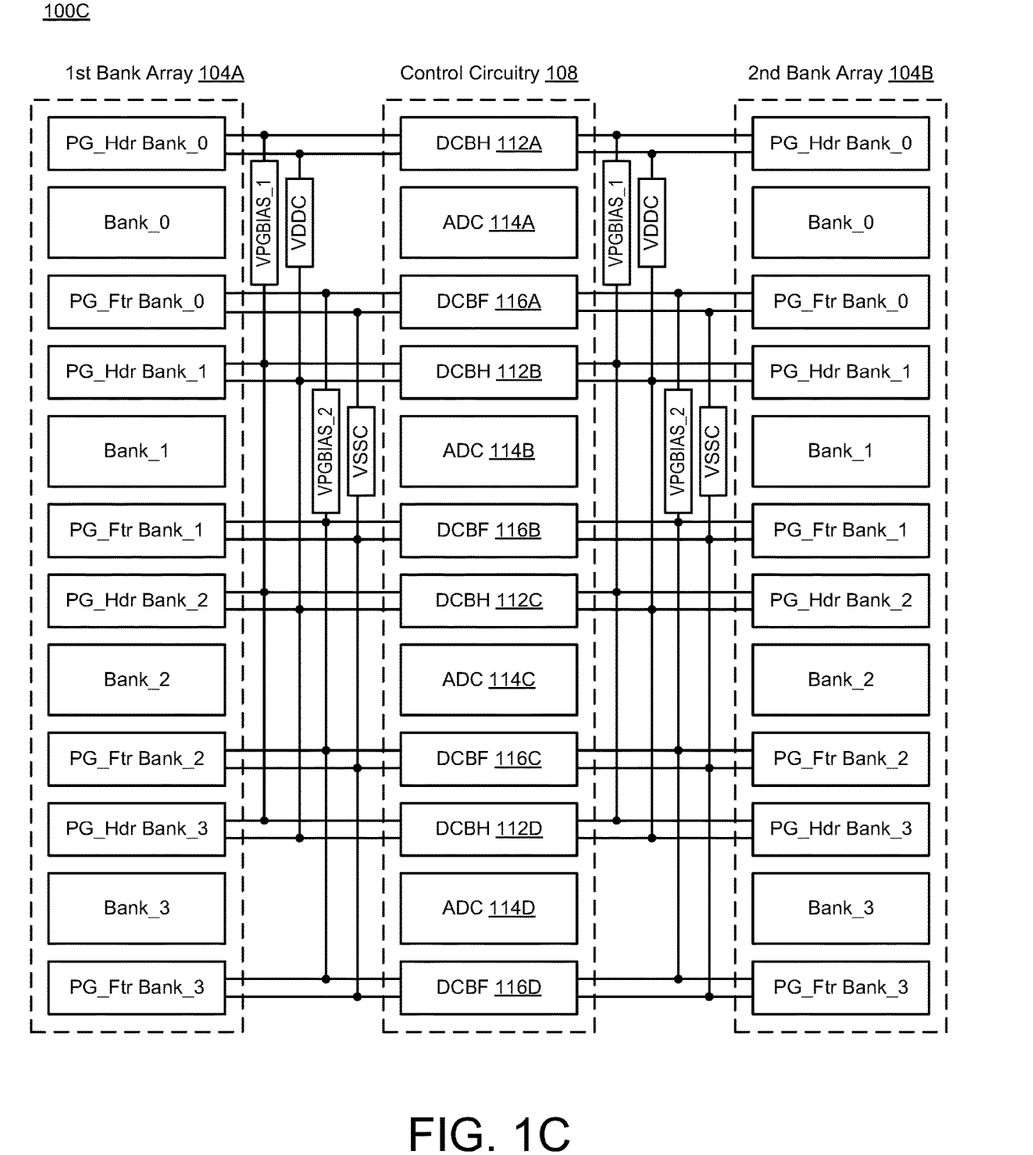

FIGS. 1A-1C illustrate various diagrams of memory circuitry in accordance with various implementations described herein. In particular, FIG. 1A illustrates memory circuitry 100A with header biasing (PG_Hdr), FIG. 1B illustrates memory circuitry 100B with footer biasing (PG_Ftr), and FIG. 1C illustrates memory circuitry 100C with header biasing and footer biasing (PG_Hdr and PG_Ftr).

FIGS. 1A-1C illustrate various diagrams of memory circuitry that is configured as integrated circuitry (IC) with header biasing and/or footer biasing. In some instances, the integrated circuitry (IC) may be implemented as a system or device with various circuit components that are arranged and coupled together as an assemblage or combination of parts that provide for a physical circuit design and related structures. In some instances, a method of designing, providing and building the integrated circuitry (IC) may involve use of the various circuit components described herein so as to thereby implement memory biasing schemes and techniques associated therewith.

As shown in FIG. 1A, the memory circuitry 100A may include one or more bank arrays (104A, 104B) including, e.g., a first bank array 104A and a second bank array 104B, and the memory circuitry 100A may include control circuitry 108 that is coupled to the first bank array 104A and the second bank array 104B. Each of the one or more bank arrays (104A, 104B) may include one or more banks of memory cells, such as, e.g., one or more bitcells, that are configured to store a bit of data. For instance, the first bank array 104A may include one or more memory banks (Bank_0, Bank_1, Bank_2, Bank_3), and the second bank array 104B may include one or more memory banks (Bank_0, Bank_1, Bank_2, Bank_3). Each of the memory banks (Bank_0, Bank_1, Bank_2, Bank_3) may include a biasing header (PG_Hdr). For instance, the first memory banks (Bank_0) may include first biasing headers (PG_Hdr Bank_0), the second memory banks (Bank_1) may include second biasing headers (PG_Hdr Bank_1), the third memory banks (Bank_2) may include third biasing headers (PG_Hdr Bank_2), and the fourth memory banks (Bank_3) may include fourth biasing headers (PG_Hdr Bank_3).

In some instances, the control circuitry 108 may include one or more distributed central biasing header circuits (DCBH 112A, 112B, 112C, 112D) along with one or more address decoder and control circuits (ADC 114A, 114B, 114C, 114D). As shown, a first ADC circuit 114A may be coupled to a first DCBH circuit 112A, and the first DCBH circuit 112A may be coupled to the first biasing headers (PG_Hdr Bank_0). Also, a second ADC circuit 114B may be coupled to a second DCBH circuit 112B, and the second DCBH circuit 112B may be coupled to the second biasing headers (PG_Hdr Bank_1). Also, a third ADC circuit 114C may be coupled to a third DCBH circuit 112C, and the third DCBH circuit 112C may be coupled to the third biasing headers (PG_Hdr Bank_2). Also, a fourth ADC circuit 114D may be coupled to a fourth DCBH circuit 112D, and the fourth DCBH circuit 112D may be coupled to the fourth biasing headers (PG_Hdr Bank_3).

In some instances, an applied core voltage (VDDC) may be coupled to each of the DCBH circuits (112A, 112B, 112C, 112D), and also, a biasing voltage (VPGBIAS_1) may be coupled to each of the DCBH circuits (112A, 112B, 112C, 112D). Further description and discussion related to the voltages (VDDC and VPGBIAS_1) are provided herein below in reference to FIGS. 2A-2C and 3A-3B.

As shown in FIG. 1B, the memory circuitry 100B may include the one or more bank arrays (104A, 104B) including, e.g., the first bank array 104A and the second bank array 104B, and the memory circuitry 100B may include the control circuitry 108 that is coupled to the first bank array 104A and the second bank array 104B. Each of the memory banks (Bank_0, Bank_1, Bank_2, Bank_3) may include a biasing footer (PG_Ftr). The first memory banks (Bank_0) may include first biasing footers (PG_Ftr Bank_0), the second memory banks (Bank_1) may include second biasing footers (PG_Ftr Bank_1), the third memory banks (Bank_2) may include third biasing footers (PG_Ftr Bank_2), and the fourth memory banks (Bank_3) may include fourth biasing footers (PG_Ftr Bank_3).

Also, the control circuitry 108 may include the one or more distributed central biasing footer circuits (DCBF 116A, 116B, 116C, 116D) and the one or more address decoder and control circuits (ADC 114A, 114B, 114C, 114D). As shown in FIG. 1B, the first ADC circuit 114A may be coupled to the first DCBF circuit 116A, and the first DCBF circuit 116A may be coupled to the first biasing footers (PG_Ftr Bank_0). The second ADC circuit 114B may be coupled to the second DCBF circuit 116B, and the second DCBF circuit 116B may be coupled to the second biasing footers (PG_Ftr Bank_1). The third ADC circuit 114C may be coupled to the third DCBF circuit 116C, and the third DCBF circuit 116C may be coupled to the third biasing footers (PG_Ftr Bank_2). Also, the fourth ADC circuit 114D may be coupled to the fourth DCBF circuit 116D, and the fourth DCBF circuit 116D may be coupled to the fourth biasing footers (PG_Ftr Bank_3).

In some instances, another applied core voltage (VSSC) may be coupled to the DCBF circuits (116A, 116B, 116C, 116D), and another biasing voltage (VPGBIAS_2) may be coupled to each of the DCBF circuits (116A, 116B, 116C, 116D). Further description and discussion related to the voltages (VSSC and VPGBIAS_2) are provided herein below in reference to FIGS. 2A-2C and 3A-3B.

As shown in FIG. 1C, the memory circuitry 100C may include the one or more bank arrays (104A, 104B) including, e.g., the first bank array 104A and the second bank array 104B, and the memory circuitry 100C may include the control circuitry 108 that is coupled to the first bank array 104A and the second bank array 104B. Each of the memory banks (Bank_0, Bank_1, Bank_2, Bank_3) may include the biasing header (PG_Hdr) and the biasing footer (PG_Ftr). For instance, the first memory banks (Bank_0) may include the first biasing headers (PG_Hdr Bank_0) and the first biasing footers (PG_Ftr Bank_0). The second memory banks (Bank_1) may include the second biasing headers (PG_Hdr Bank_1) and the second biasing footers (PG_Ftr Bank_1). The third memory banks (Bank_2) may include the third biasing headers (PG_Hdr Bank_2) and the third biasing footers (PG_Ftr Bank_2). Also, the fourth memory banks (Bank_3) may include the fourth biasing headers (PG_Hdr Bank_3) and the fourth biasing footers (PG_Ftr Bank_3).

In some instances, the control circuitry 108 may include the distributed central biasing header circuits (DCBH 112A, 112B, 112C, 112D), the distributed central biasing footer circuits (DCBF 116A, 116B, 116C, 116D), and the address decoder and control circuits (ADC 114A, 114B, 114C, 114D). The first ADC circuit 114A may be coupled to the first DCBH circuit 112A, and the first DCBH circuit 112A may be coupled to the first biasing headers (PG_Hdr Bank_0), and also, the first ADC circuit 114A may be coupled to the first DCBF circuit 116A, and the first DCBF circuit 116A may be coupled to the first biasing footers (PG_Ftr Bank_0). The second ADC circuit 114B may be coupled to a second DCBH circuit 112B, and the second DCBH circuit 112B may be coupled to the second biasing headers (PG_Hdr Bank_1), and also, the second ADC circuit 114B may be coupled to the second DCBF circuit 116B, and the second DCBF circuit 116B may be coupled to the second biasing footers (PG_Ftr Bank_1). The third ADC circuit 114C may be coupled to a third DCBH circuit 112C, and the third DCBH circuit 112C may be coupled to the third biasing headers (PG_Hdr Bank_2), and also, the third ADC circuit 114C may be coupled to the third DCBF circuit 116C, and the third DCBF circuit 116C may be coupled to the third biasing footers (PG_Ftr Bank_2). The fourth ADC circuit 114D may be coupled to a fourth DCBH circuit 112D, and the fourth DCBH circuit 112D may be coupled to the fourth biasing headers (PG_Hdr Bank_3), and also, the fourth ADC circuit 114D may be coupled to the fourth DCBF circuit 116D, and the fourth DCBF circuit 116D may be coupled to the fourth biasing footers (PG_Ftr Bank_3).

In some instances, the applied core voltage (VDDC) may be coupled to each of the DCBH circuits (112A, 112B, 112C, 112D), and also, the other applied core voltage (VSSC) may be coupled to the DCBF circuits (116A, 116B, 116C, 116D). In addition, the biasing voltage (VPGBIAS_1) may be coupled to each of the DCBH circuits (112A, 112B, 112C, 112D), and also, the other biasing voltage (VPGBIAS_2) may be coupled to each of the DCBF circuits (116A, 116B, 116C, 116D). Additional description and discussion related to the voltages (VDDC, VSSC, VPGBIAS_1 and VPGBIAS_2) are provided herein below in reference to FIGS. 2A-2C and 3A-3B.

In accordance with FIGS. 1A-1C, various schemes and techniques described herein provide for central biasing amplifiers that are placed along side the banks of arrays in the central address decoder column. Advantageously, this configuration may reduce the overall distributed resistor-capacitor (RC) effect on the VPGBIAS, VDDC and/or VSSC supply rails. In some instances, the core voltage (VDDC) may settle at higher voltages when the number of rows is decreased, such as, e.g., from 512 to 32 rows per bank. However, the array leakage improvements may be about 30% to 50% better than various other retention modes. Also, in other instances, post-manufacturing trim may be used to reduce VDDC variations further.

Figure 2A:
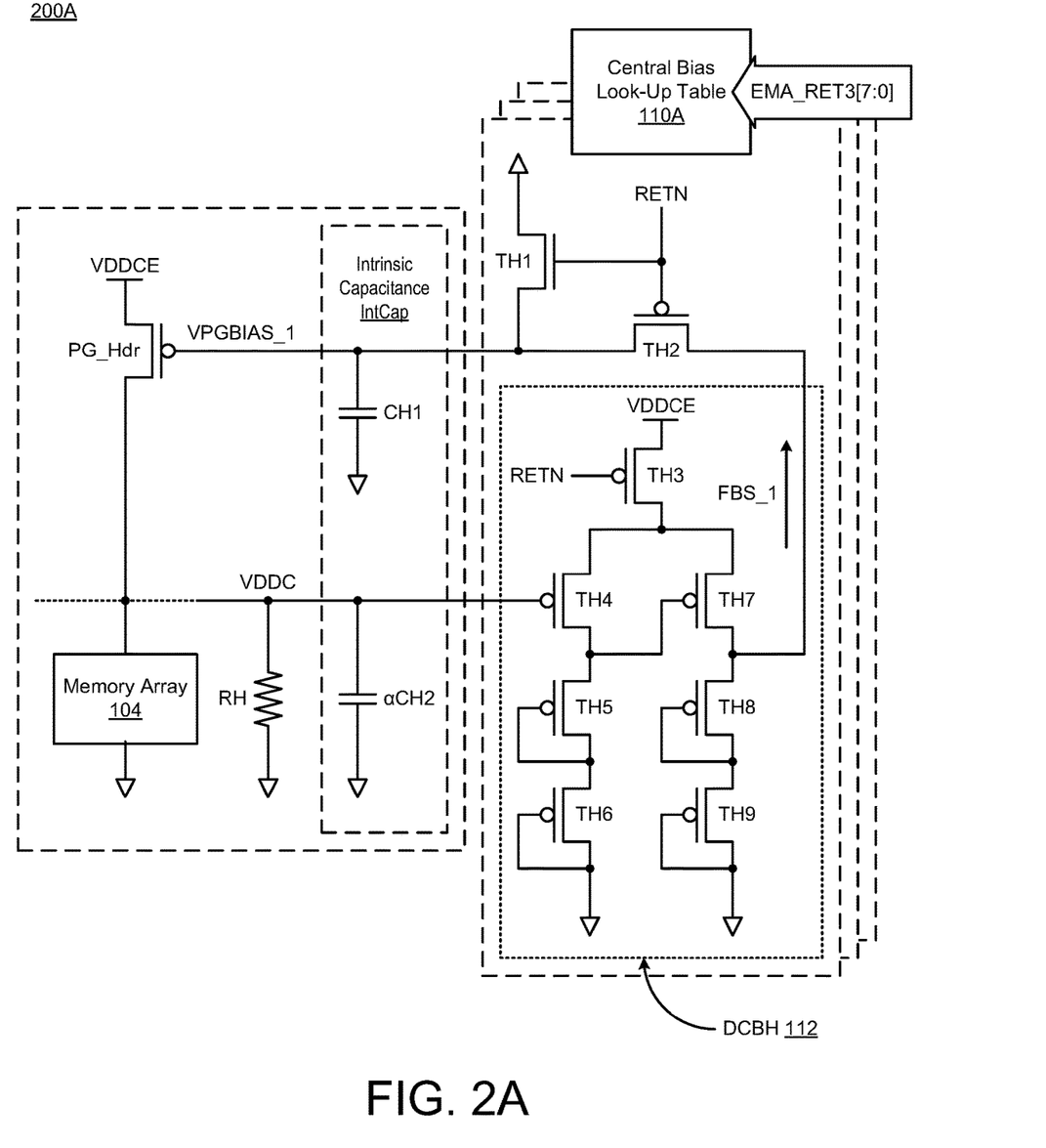
FIGS. 2A-2C illustrate various diagrams of biasing circuitry in accordance with various implementations described herein.
Figure 2B:
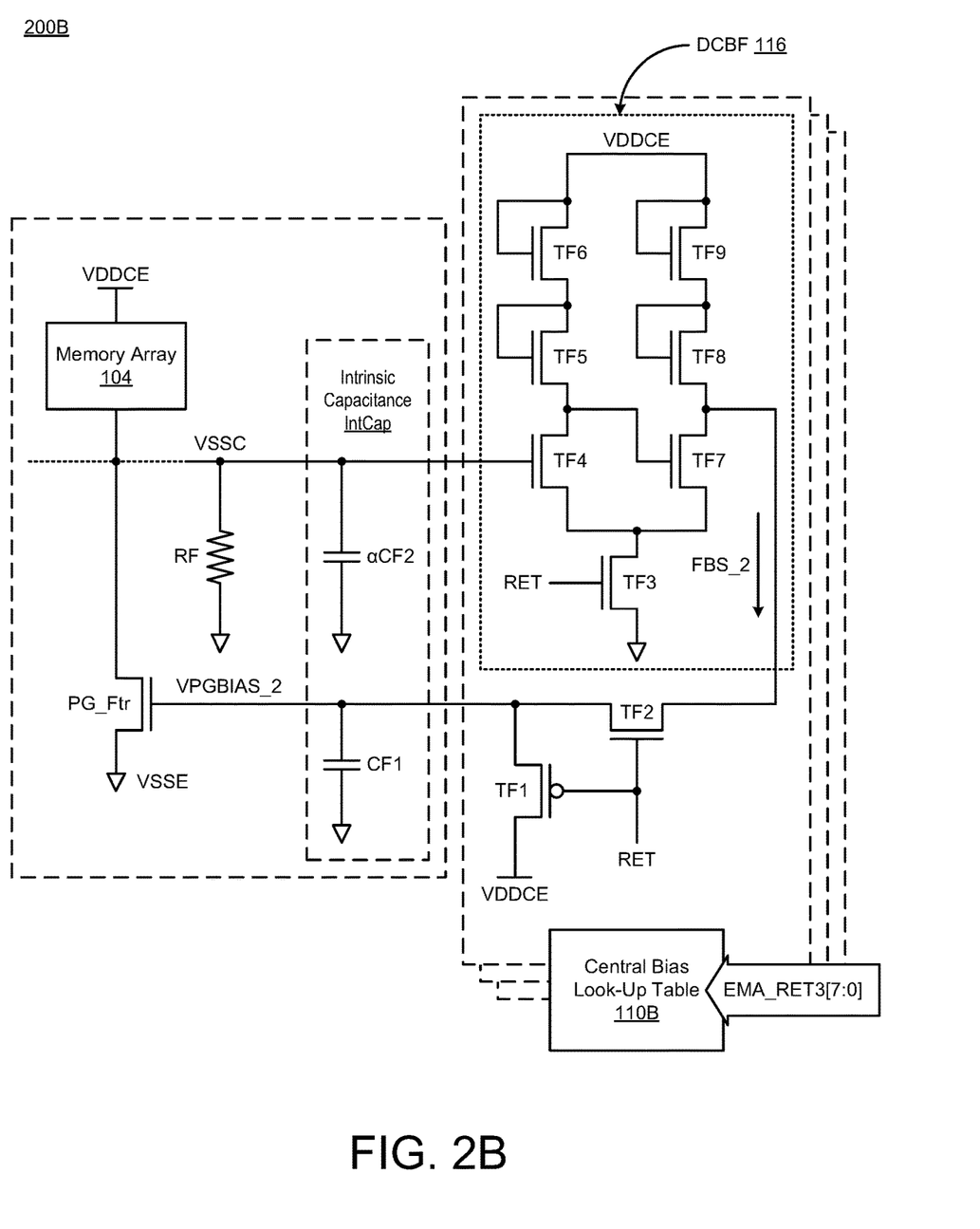
Figure 2C:
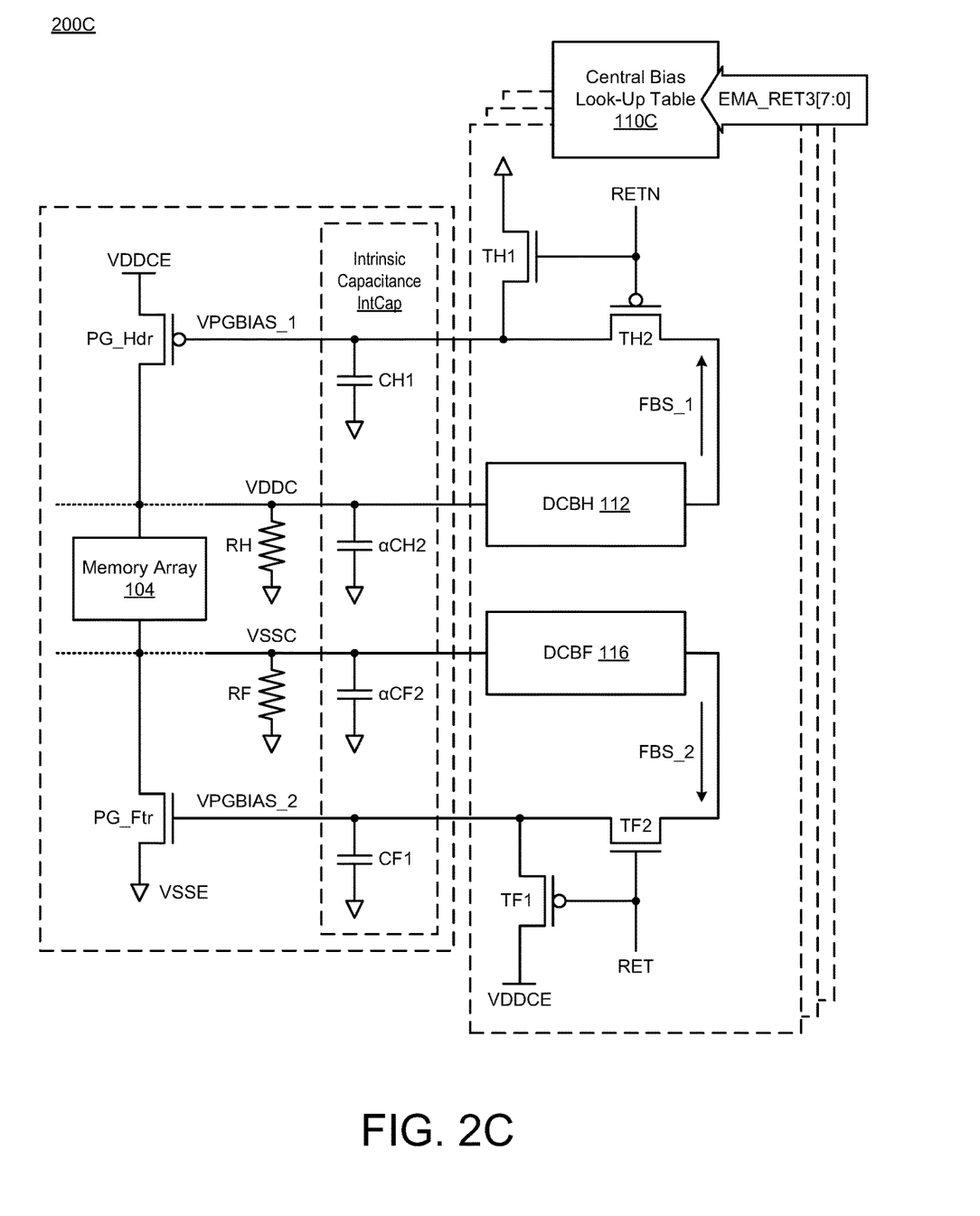

FIGS. 2A-2C illustrate various diagrams of biasing circuitry in accordance with various implementations described herein. In particular, FIG. 2A shows header biasing circuitry 200A, FIG. 2A shows footer biasing circuitry 200B, and also, FIG. 2C shows header and footer biasing circuitry 200C. In some instances, the biasing circuitry may be implemented as a system or device having various circuit components that are arranged and coupled together as an assemblage or combination of parts that provide for a physical circuit design and related structures. Also, a method of designing, providing and building the biasing circuitry may involve use of various circuit components described herein so as to thereby implement memory biasing techniques associated therewith.

As shown in FIG. 2A, the header biasing circuitry 200A may include a memory array 104 that operates with a core voltage (VDDCE). In some instances, the core voltage (VDDCE) may refer to a positive supply voltage (e.g., >0V). In some instances, the header biasing circuitry 200A only uses the core voltage (VDDCE) as a single operating voltage for one or more of the memory array 104, the power gating switch (PG_Hdr), and/or the biasing stage (DCBH 112). As such, the biasing stage (DCBH 112) does not need any other separate analog reference voltage, e.g., bandgap, etc.

The header biasing circuitry 200A may include a power gating switch (PG_Hdr) that provides the core voltage (VDDCE) to the memory array 104. In some instances, the power gating switch (PG_Hdr) may be adapted to pass the core voltage (VDDCE) to the memory array 104 as an applied core voltage (VDDC) when activated. As such, in various instances, the applied core voltage (VDDC) may be selectively variable between ground (e.g., VSS or GND at 0V) and the core voltage (VDDCE). In some instances, the power gating switch (PG_Hdr) may be implemented with a transistor, and the biasing stage (DCBH 112) may activate the power gating switch (PG_Hdr) by providing a voltage biasing signal (VPGBIAS_1) to a gate of the transistor. The biasing stage (DCBH 112) may be referred to as a distributed central biasing header (DCBH) or a central biasing header (CBH). In some instances, the biasing stage (DCBH 112) may exclude a need for a reference voltage generator, and thus, the biasing stage (DCBH 112) may be self-biased and reference-free with no reference voltage needed.

The header biasing circuitry 200A may include a biasing stage (DCBH 112) that selectively activates the power gating switch (PG_Hdr) based on sensing a changing voltage level of the applied core voltage (VDDC). In some instances, the header biasing circuitry 200A may provide the voltage biasing signal (VPGBIAS_1) to the gate of the power gating switch (PG_Hdr), and a biasing voltage level of the voltage biasing signal (VPGBIAS_1) may be selectively increased and applied to the gate of the transistor (i.e., power gating switch PG_Hdr) based on sensing an increase in the changing voltage level of the applied core voltage (VDDC). Also, in other instances, the biasing voltage level of the voltage biasing signal (VPGBIAS_1) may be selectively decreased and applied to the gate of the transistor (i.e., power gating switch PG_Hdr) based on sensing a decrease in the changing voltage level of the applied core voltage (VDDC).

In some instances, the core voltage (VDDCE) may refer to a positive supply voltage (e.g., >0V), and also, the power gating switch (PG_Hdr) may be implemented as a header device (e.g., a header transistor) that is coupled between the positive supply voltage (VDDCE) and the memory array 104. The header device may be a p-type power gating transistor (e.g., PMOS_PG) that is selectively activated with a negative feedback signal (FBS_1) provided by the biasing stage (DCBH 112). In some instances, the biasing stage (DCBH 112) may include a number (N) of p-type transistors (PMOS transistors) that are arranged and coupled together to receive the applied core voltage (VDDC) from the p-type power gating transistor (i.e., header transistor PG_Hdr) and to selectively apply the negative feedback signal (FBS_1) to the gate of the p-type power gating transistor (i.e., header transistor PG_Hdr) based on sensing the changing voltage level of the applied core voltage (VDDC). Thus, the biasing stage (DCBH 112) may use leakage current drawn from a settled voltage level of the core voltage (VDDCE), e.g., as a reference current to bias itself and thereby generate any regulation.

In FIG. 2A, the header biasing circuitry 200A may include transistors (TH1, TH2), wherein transistor (TH1) may be coupled between the gate of the header transistor (PG_Hdr) and ground, and wherein transistor (TH2) may be coupled between an output of transistor (TH7) and the gate of the header transistor (PG_Hdr). As shown, a retention signal (RETN) may be coupled to gates of transistors (TH1, TH2). Also, transistor (TH1) may be an NMOS transistor, and transistor (TH2) may be a PMOS transistor. In some instances, the negative feedback signal (FBS_1) may be provided by output of transistor (TH7) and pass through transistor (TH2) to a gate of the header transistor (PG_Hdr) when transistor (TH2) is activated. Also, a first header capacitor (CH1) may be coupled between the gate of header transistor (PG_Hdr) and ground.

In some instances, the DCBH 112 may include a first series stack of transistors (TH4, TH5, TH6) coupled in parallel with a second series stack of transistors (TH7, TH8, TH9). Also, the stacks of transistors (TH4, TH5, TH6 and TH7, TH8, TH9) may be coupled between transistor (TH3) and ground, and the DCBH 112 may include transistor (TH3) coupled between the core voltage (VDDCE) and inputs of transistors (TH4, TH7). The retention signal (RETN) may be coupled to a gate of transistor (TH3). Also, the output of the header transistor (PG_Hdr) may be coupled to a gate of transistor (TH4), and an output of transistor (TH4) may be coupled to a gate of transistor (TH7). Transistors (TH5, TH6, TH8, TH9) may be coupled as diodes, wherein transistors (TH5, TH6) are coupled between the output of transistor (TH4) and ground, and wherein transistors (TH8, TH9) are coupled between the output of transistor (TH7) and ground. In some instances, a header resistor (RH) and a second header capacitor (αCH2) may be coupled in parallel between output of the header transistor (PG_Hdr) and a gate of transistor (TH4). In some instances, the second header capacitor (αCH2) may refer to an intrinsic capacitance for loop stability, wherein the intrinsic capacitance (IntCap) may be used to dampen feedback oscillation in the loop. Also, in some instances, transistors (TH3, TH4, TH5, TH6, TH7, TH8, TH9) may be PMOS transistors.

In some implementations, the DCBH 112 and transistors (TH1, TH2) may be modified and/or configured as part of a central bias look-up table 110A that may be used to provide multiple different sizes of amplifying circuitry. For instance, in accordance with some implementations described herein, the DCBH 112 and transistors (TH1, TH2) may be configured to operate as an amplifier that may be sized for various voltage levels and/or operating ranges of the core voltage (VDDCE). The applied core voltage (VDDC) and the biasing voltage (VPGBIAS_1) are derived from the core voltage (VDDCE), and the derived voltages (VDDC, VPGBIAS_1) are used to control input of the core voltage (VDDCE) provided to the memory array 104 via the header transistor (PG_Hdr).

In some implementations, the EMA_RET3[7:0] signal may supply an index value into the central bias look-up table 110A so as to select appropriate sizes for the amplifier formed by DCBH 112. As such, the EMA_RET3[7:0] signal may be used to modify and/or configure the DCBH 112 and/or transistors (TH1, TH2) with the index value in reference to the central bias look-up table 110A so as to select and/or provide appropriate sizes for the amplifying circuitry.

As shown in FIG. 2B, the footer biasing circuitry 200B may be implemented as an alternative structure to the header biasing circuitry 200A of FIG. 2A. For instance, the footer biasing circuitry 200B may include a power gating switch (PG_Ftr) that provides the core voltage (VSSE) to the memory array 104. In some instances, the power gating switch (PG_Ftr) may be adapted to pass the core voltage (VSSE) as an applied core voltage (VSSC) to the memory array 104 when activated. As such, in various instances, the applied core voltage (VSSC) may be selectively variable between ground (e.g., 0V) and the core supply voltage (VDDCE). In some instances, the power gating switch (PG_Ftr) may be implemented with a transistor, and the biasing stage (DCBF 116) may activate the power gating switch (PG_Ftr) by providing a voltage biasing signal (VPGBIAS_2) to a gate of the transistor. The biasing stage (DCBF 116) may be referred to as a distributed central biasing footer (DCBF) or a central biasing footer (CBF). Also, in some instances, the biasing stage (DCBF 116) may exclude need for a reference voltage generator, and thus, the biasing stage (DCBF 116) may be self-biased and reference-free with no reference voltage needed.

The footer biasing circuitry 200B may include a biasing stage (DCBF 116) that selectively activates the power gating switch (PG_Ftr) based on sensing a changing voltage level of the applied core voltage (VSSC). In some instances, the footer biasing circuitry 200B may provide the voltage biasing signal (VPGBIAS_2) to the gate of the power gating switch (PG_Ftr), and a biasing voltage level of the voltage biasing signal (VPGBIAS_2) may be selectively increased and applied to the gate of the transistor (i.e., power gating switch PG_Ftr) based on sensing an increase in the changing voltage level of the applied core voltage (VSSC). Also, in other instances, the biasing voltage level of the voltage biasing signal (VPGBIAS_2) may be selectively decreased and applied to the gate of the transistor (i.e., power gating switch PG_Ftr) based on sensing a decrease in the changing voltage level of the applied core voltage (VSSC).

In some instances, the core voltage (VSSE) may refer to a negative supply voltage (e.g., ≤0V), and also, the power gating switch (PG_Ftr) may be implemented as a footer device (e.g., a footer transistor) that is coupled between the negative supply voltage (VSSE) and the memory array 104. The footer device may be an n-type power gating transistor (e.g., NMOS_PG) that is selectively activated with a positive feedback signal (FBS_2) provided by the biasing stage (DCBF 116). In some instances, the biasing stage (DCBF 116) may include a number (N) of n-type transistors (NMOS transistors) that are arranged and coupled together to receive the negative supply voltage (VSSE) from the n-type power gating transistor (i.e., footer transistor PG_Ftr) and to selectively apply the positive feedback signal (FBS_2) to the gate of the p-type power gating transistor (i.e., footer transistor PG_Ftr) based on sensing the changing voltage level of the applied core voltage (VSSC).

In some instances, the footer biasing circuitry 200B only uses the core voltage (VDDCE) as a single operating voltage for one or more of the memory array 104, the power gating switch (PG_Ftr), and/or the biasing stage (DCBF 116). As such, the biasing stage (DCBF 116) does not need any other separate analog reference voltage, e.g., bandgap, etc. Also, in some instances, the biasing stage (DCBF 116) may use leakage current that is drawn from a settled voltage level of the core voltage (VDDCE), e.g., as a reference current to bias itself and thereby generate any regulation.

In FIG. 2B, the footer biasing circuitry 200B may include transistors (TF1, TF2), wherein transistor (TF1) may be coupled between the gate of the footer transistor (PG_Ftr) and the core voltage (VDDCE), and wherein transistor (TF2) may be coupled between an output of transistor (TF7) and the gate of the footer transistor (PG_Ftr). As shown, a retention signal (RET) may be coupled to gates of transistors (TF1, TF2). Also, transistor (TF1) may be a PMOS transistor, and transistor (TF2) may be an NMOS transistor. In some instances, the positive feedback signal (FBS_2) may be provided by an output of transistor (TF7) and pass through transistor (TF2) to a gate of the footer transistor (PG_Ftr) when transistor (TF2) is activated. Also, a first footer capacitor (CF1) may be coupled between the gate of footer transistor (PG_Ftr) and ground.

In some instances, the DCBF 116 may include a first series stack of transistors (TF4, TF5, TF6) coupled in parallel with a second series stack of transistors (TF7, TF8, TF9). The stacks of transistors (TH4, TH5, TH6 and TH7, TH8, TH9) may be coupled between the core voltage (VDDCE) and transistor (TF3), and the DCBF 116 may include transistor (TF3) coupled between outputs of transistors (TF4, TF7) and ground. The retention signal (RET) may be coupled to a gate of transistor (TF3). The output of the footer transistor (PG_Ftr) may be coupled to a gate of transistor (TF4), and an output of transistor (TF4) may be coupled to a gate of transistor (TF7). Transistors (TF5, TF6, TF8, TF9) may be coupled as diodes, wherein transistors (TF5, TF6) are coupled between the core voltage (VDDCE) and the input of transistor (TF4), and wherein transistors (TF8, TF9) are coupled between the core voltage (VDDCE) and the input of transistor (TF7). In some instances, a footer resistor (RF) and a second footer capacitor (αCF2) may be coupled in parallel between the output of the footer transistor (PG_Ftr) and the gate of transistor (TF4). In some instances, the second footer capacitor (αCF2) may refer to an intrinsic capacitance for loop stability, wherein the intrinsic capacitance (IntCap) may be used to dampen feedback oscillation in the loop. Also, in some instances, transistors (TF3, TF4, TF5, TF6, TF7, TF8, TF9) may be NMOS transistors.

In some implementations, the DCBF 116 and transistors (TF1, TF2) may be modified and/or configured as part of a central bias look-up table 110B that may be used to provide multiple different sizes of amplifying circuitry. For instance, in accordance with some implementations described herein, the DCBF 116 and transistors (TF1, TF2) may be configured to operate as an amplifier that may be sized for various voltage levels and/or operating ranges of the core voltage (VDDCE). In this instance, the applied core voltage (VSSC) and the biasing voltage (VPGBIAS_2) are derived from the core voltage (VSSE), and the derived voltages (VSSC, VPGBIAS_2) are used to control input of the core voltage (VSSE) provided to the memory array 104 via the footer transistor (PG_Ftr).

In some implementations, as in the header case, the EMA_RET3[7:0] signal may supply an index value into the central bias look-up table 110B so as to select appropriate sizes for the amplifier formed by DCBF 116. As such, the EMA_RET3[7:0] signal may be used to modify and/or configure the DCBF 116 and/or transistors (TF1, TF2) with the index value in reference to the central bias look-up table 110B so as to select and/or provide appropriate sizes for the amplifying circuitry.

As shown in FIG. 2C, the header and footer biasing circuitry 200C may be implemented as an alternative structure to the header biasing circuitry 200A of FIG. 2A and/or the footer biasing circuitry 200B of FIG. 2B. For instance, the header and footer biasing circuitry 200C may include a system of components, e.g., including components of the header biasing circuitry 200A of FIG. 2A and/or components of the footer biasing circuitry 200B of FIG. 2B.

In some instances, the header and footer biasing circuitry 200C may include the memory array 104 may be coupled between a first voltage (VDDC) and a second voltage (VSSC). The first voltage (VDDC) may be referred to as a core supply voltage, and the second voltage (VSSC) may be referred to as a negative supply voltage.

The header and footer biasing circuitry 200C may include the header device (PG_Hdr) and the footer device (PG_Ftr). The header device (PG_Hdr) may be adapted to power gate the first voltage (VDDC) to the memory array 104, and the footer device (PG_Ftr) may be adapted to power gate the second voltage (VSSC) to the memory array 104. In some instances, the header device (PG_Hdr) may pass the core supply voltage (VDDC) to the memory array 104 when activated, and the footer device (PG_Ftr) may pass the negative supply voltage (VSSC) to the memory array 104 when activated.

The header and footer biasing circuitry 200C may include the central biasing header stage (DCBH 112) and the central biasing footer stage (DCBF 116). The central biasing header stage (DCBH 112) may be configured to selectively activate the header device (PG_Hdr) based on sensing changing voltage levels of the first voltage (VDDC), and the central biasing footer stage (DCBF 116) may be configured to selectively activate the footer device (PG_Ftr) based on sensing changing voltage levels of the second voltage (VSSC).

In some instances, the header device (PG_Hdr) may be implemented with the p-type header transistor (PMOS_PG), and the central biasing header stage (DCBH 112) may be adapted to selectively activate the header device (PG_Hdr) by applying a negative voltage biasing signal (Negative VPGBIAS_1) to the gate of the p-type header transistor (PMOS_PG). Also, the footer device (PG_Ftr) may be implemented with an n-type footer transistor (NMOS_PG), and the central biasing footer stage (DCBF 116) may be adapted to selectively activate the footer device (PG_Ftr) by applying a positive voltage biasing signal (Positive VPGBIAS_2) to the gate of the n-type footer transistor (NMOS_PG).

In some implementations, a voltage level of the negative voltage biasing signal (Negative VPGBIAS_1) may be selectively increased and applied to the gate of the p-type header transistor (PMOS_PG) based on sensing an increase in the changing voltage level of the first voltage (VDDC), and the voltage level of the negative voltage biasing signal (Negative VPGBIAS_1) may be selectively decreased and applied to the gate of the p-type header transistor (PMOS_PG) based on sensing a decrease in the changing voltage level of the first voltage (VDDC). Also, a voltage level of the positive voltage biasing signal (Positive VPGBIAS_2) may be selectively increased and applied to the gate of the n-type footer transistor (NMOS_PG) based on sensing an increase in the changing voltage levels of the second voltage (VSSC), and the voltage level of the positive voltage biasing signal (Positive VPGBIAS_2) may be selectively decreased and applied to the gate of the n-type footer transistor (NMOS_PG) based on sensing a decrease in the changing voltage levels of the second voltage (VSSC).

In some instances, the header and footer biasing circuitry 200C only uses the core voltages (VDDC, VSSC) as operating voltages for one or more of the memory array 104, the power gating switches (PG_Hdr, PG_Ftr), and/or the biasing stages (DCBH 112, DCBF 116). As such, the biasing stages (DCBH 112, DCBF 116) may not need any other separate analog reference voltages, e.g., bandgap, etc. Also, the biasing stages (DCBH 112, DCBF 116) may use leakage current drawn from settled voltage levels of the core voltages (VDDC, VSSC), e.g., as reference currents to bias themselves and thereby provide for any regulation.

In some implementations, the DCBH 112, the DCBF 116 and transistors (TH1, TH2, TF1, TF2) may be modified and/or configured as part of a central bias look-up table 100C that may be used to provide multiple different sizes of amplifying circuitry. For instance, in accordance with some implementations described herein, the DCBH 112 and transistors (TH1, TH2) may be configured to operate as a header amplifier that may be sized for various voltage levels and/or operating ranges of the core voltage (VDDC). Also, the DCBF 116 and transistors (TF1, TF2) may be configured to operate as a footer amplifier that may be sized for various voltage levels and/or operating ranges of the core voltage (VSSC). In this instance, the applied core voltages (VDDC, VSSC) and the biasing voltages (VPBIAS_1, VPBIAS_2) are derived from the core voltages (VDDC, VSSC), respectively, and the derived voltages (VDDC, VSSC, VPGBIAS_1 and VPGBIAS_2) are used to control input of the core voltages (VDDC, VSSC) provided to the memory array 104 via the header transistor (PG_Hdr) and the footer transistor (PG_Ftr), respectively.

In some implementations, the EMA_RET3[7:0] signal may supply an index value into the central bias look-up table 110C so as to select appropriate sizes for the amplifier formed by DCBH 112 and/or DCBF 116. As such, the EMA_RET3[7:0] signal may be used to modify and/or configure the DCBH 112, DCBF 116, transistors (TH1, TH2) and/or transistors (TF1, TF2) with the index value in reference to the central bias look-up table 110C so as to select and/or provide appropriate sizes for the amplifying circuitry.

The schemes and techniques described herein may provide for controlling gate voltage of the power-gating (PG) header device (and/or the PG footer device). In some instances, PG gate voltage may be self-adjusted so as to ensure that a retention voltage (VRET) is maintained across the PVT range. As described herein, the PG header and/or footer device uses central biasing with multiple inverting amplifier stages. In this instance, the array voltage (VDDC, or VSSC) may be used as a biasing voltage for the central bias amplifier, and the central biasing amplifier generates the biasing voltage (VPGBIAS) for achieving VDDC=VRET (e.g., 600 mV). Also, the PG header and/or the PG footer device plus an array may be used to form another inverting amplifier having an amplifying gain near VPGBIAS, and a closed loop may be formed with these amplifying stages. As a result, no external regulated voltage reference is used with the schemes and techniques described herein, and the biasing voltage VPGBIAS may vary across PVT. However, in some instances, sensitivity to PVT variations may be reduced in the closed loop, and as such, higher loop gain may be an improvement over conventional practice.

Figure 3A:
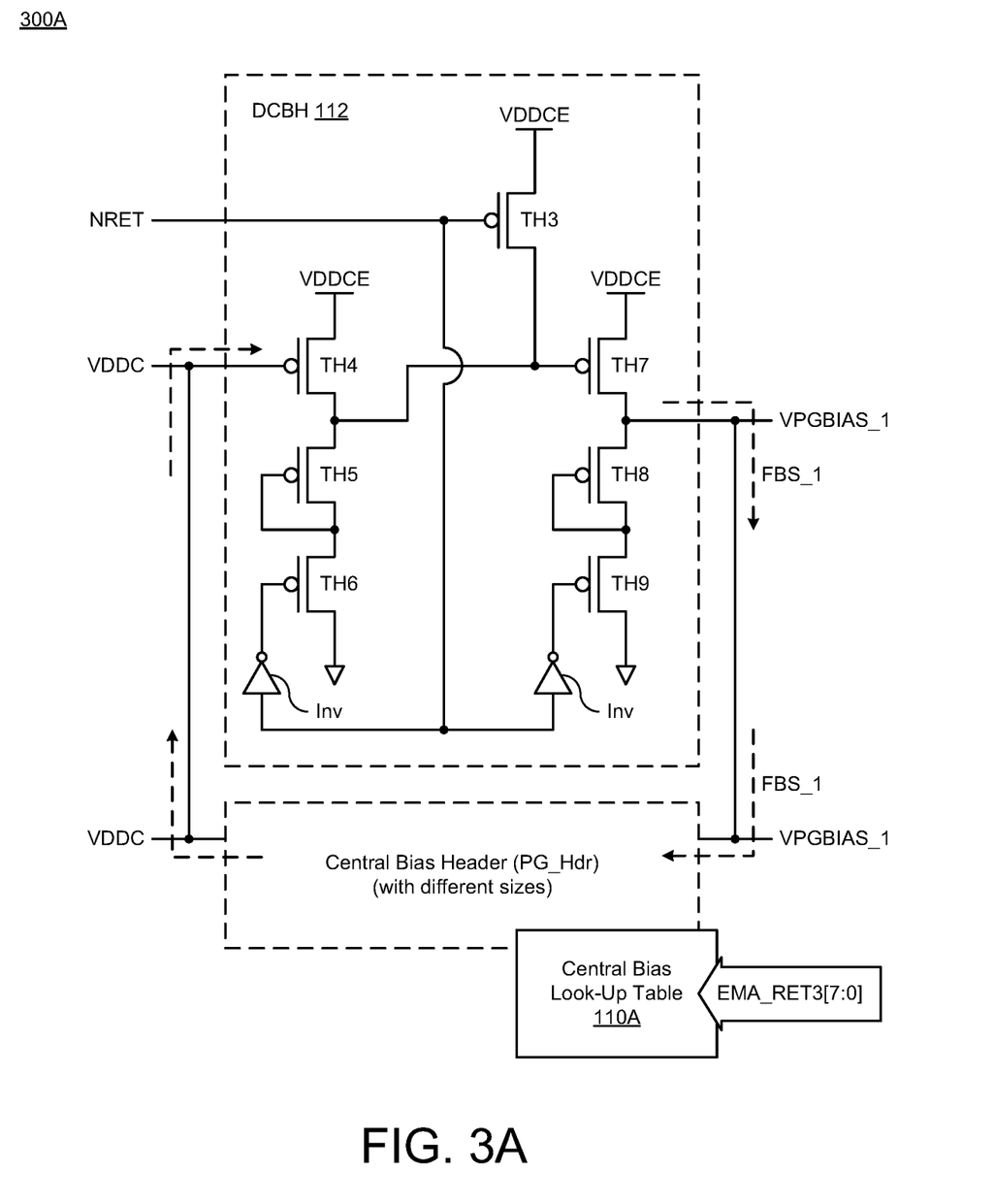
FIGS. 3A-3B illustrate diagrams of central biasing circuitry in accordance with various implementations described herein.
Figure 3B:
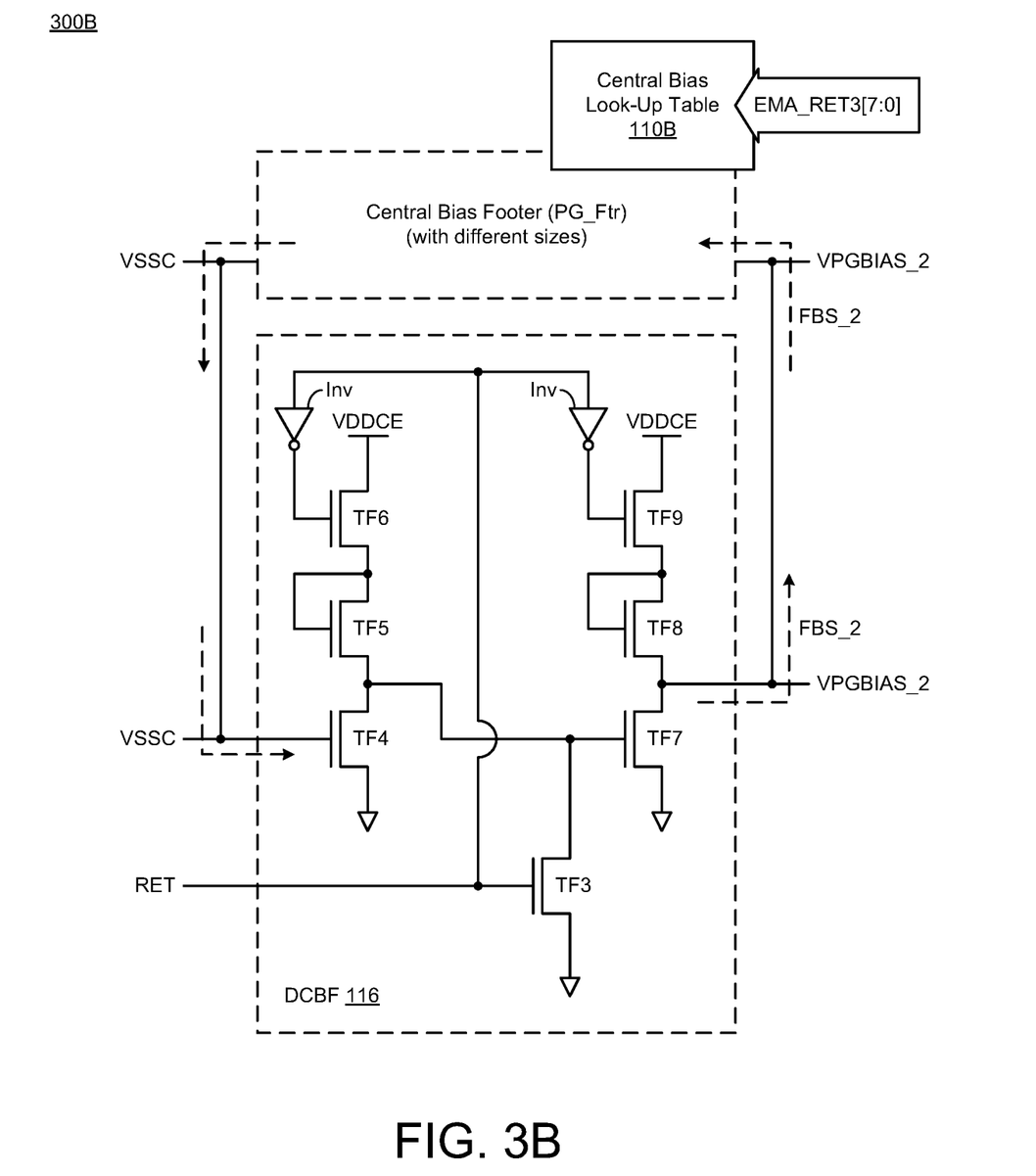

FIGS. 3A-3B illustrate diagrams of central biasing circuitry in accordance with various implementations described herein. In particular, FIG. 3A illustrates a diagram of central biasing header circuitry 300A, and FIG. 3B illustrates a diagram of central biasing footer circuitry 300B. In some instances, the central biasing header circuitry 300A of FIG. 3A may include one or more components similar to the header biasing circuitry 200A of FIG. 2A, and the central biasing footer circuitry 300B of FIG. 3B may include one or more components similar to the footer biasing circuitry 200B of FIG. 2B.

As shown in FIG. 3A, the central biasing header circuitry 300A may include the DCBH 112 including the first series stack of transistors (TH4, TH5, TH6) coupled in parallel with the second series stack of transistors (TH7, TH8, TH9). Also, the stacks of transistors (TH4, TH5, TH6 and TH7, TH8, TH9) may be coupled between the core voltage (VDDCE) and ground, and the DCBH 112 may include transistor (TH3) coupled between the core voltage (VDDCE) and the gate of transistor (TH7). In some instances, the retention signal (NRET) may be coupled to the gate of transistor (TH3) and also coupled to gates of transistors (TH6, TH9) via inverters (Inv). An output (VDDC) of central bias header (PG_Hdr) may be coupled to a gate of transistor (TH4), and an output of transistor (TH4) may be coupled to a gate of transistor (TH7). An output (VPGBIAS_1) of transistor (TH7) may be coupled to an input of the central bias header (PG_Hdr), and the biasing voltage (VPBIAS) may be provided from output of transistor (TH7) to the central bias header (PG_Hdr). Also, transistors (TH5, TH8) may be coupled as diodes, wherein transistors (TH5, TH6) are coupled between the output of transistor (TH4) and ground, and wherein transistors (TH8, TH9) are coupled between the output of transistor (TH7) and ground. In some instances, transistors (TH3, TH4, TH5, TH6, TH7, TH8, TH9) may be PMOS transistors. Also, the EMA_RET3[7:0] signal may supply the index value into the central bias look-up table 110A so as to select appropriate sizes for the amplifier formed by the central bias header (PG_Hdr) with different sizes.

In some implementations, the DCBH 112 may be modified and/or configured to provide multiple different sizes of amplifying circuitry. For instance, as described herein, the DCBH 112 may be configured to operate as an amplifier that may be sized for various voltage levels and/or operating ranges of the core voltage (VDDCE). In this instance, the applied core voltage (VDDC) and the biasing voltage (VPBIAS) are derived from the core voltage (VDDCE), and the derived voltages (VDDC, VPGBIAS_1) are used to control input of the core voltage (VDDCE) provided to the central bias header (PG_Hdr).

As shown in FIG. 3B, the central biasing footer circuitry 300B may include the DCBF 116 including the first series stack of transistors (TF4, TF5, TF6) coupled in parallel with the second series stack of transistors (TF7, TF8, TF9). The stacks of transistors (TH4, TH5, TH6 and TH7, TH8, TH9) may be coupled between the core voltage (VDDCE) and ground, and the DCBF 116 may include transistor (TF3) coupled between the gate of transistor (TF7) and ground. The retention signal (RET) may be coupled to the gate of transistor (TF3) and also coupled to gates of transistors (TF6, TF9) via inverters (Inv). An output (VSSC) of central bias footer (PG_Ftr) may be coupled to a gate of transistor (TF4), and an output of transistor (TF5) may be coupled to a gate of transistor (TF7). An output (VPGBIAS_2) of transistor (TF8) may be coupled to an input of the central bias footer (PG_Ftr), and the biasing voltage (VPBIAS) may be provided from the output of transistor (TF7) to the central bias footer (PG_Ftr). Transistors (TF5, TF8) may be coupled as diodes, wherein transistors (TF5, TF6) are coupled between the core voltage supply (VDDCE) and the input of transistor (TF4), and transistors (TF8, TF9) are coupled between the core voltage supply (VDDCE) and the input of transistor (TF7). Transistors (TF3, TF4, TF5, TF6, TF7, TF8, TF9) may be NMOS transistors. Also, the EMA_RET3 [7:0] signal may supply the index value into the central bias look-up table 110B so as to select appropriate sizes for the amplifier formed by the central bias footer (PG_Ftr) with different sizes.

In some implementations, the DCBF 116 may be modified and/or configured to provide multiple different sizes of amplifying circuitry. For instance, as described herein, the DCBF 116 may be configured to operate as an amplifier that may be sized for various voltage levels and/or operating ranges of the core voltage (VSSE). In this instance, the applied core voltage (VSSC) and the biasing voltage (VPBIAS) are derived from the core voltage (VSSE), and the derived voltages (VSSC, VPGBIAS_2) are used to control input of the core voltage (VSSE) provided to the central biasing footer (PG_Ftr).

Described herein are various implementations of a device. The device may include a memory array that operates with an applied core voltage. The device may include a power gating switch that receives a core supply voltage and provides the applied core voltage to the memory array. The device may include a biasing stage that selectively activates the power gating switch based on sensing a changing voltage level of the applied core voltage.

Described herein are various implementations of a system. The system may include a memory array coupled between a first voltage and a second voltage. The system may include a header device that power gates the first voltage to the memory array. The system may include a footer device that power gates the second voltage to the memory array. The system may include a central biasing header stage that selectively activates the header device based on sensing a changing voltage level of the first voltage. The system may include a central biasing footer stage that selectively activates the footer device based on sensing a changing voltage level of the second voltage.

Described herein are various implementations of a method. The method may include providing an applied core voltage for operating a memory array. The method may include power gating a core supply voltage so as to provide the applied core voltage to the memory array with a pass transistor. The method may include selectively activating the pass transistor based on sensing a changing voltage level of the applied core voltage.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
    a memory array that operates with an applied core voltage;
    a power gating circuit having only one power gating switch with a single transistor coupled in series between a core supply voltage and the memory array, wherein the single transistor receives the core supply voltage and provides the applied core voltage to the memory array, and wherein the single transistor has a single gate, and wherein the core supply voltage refers to a positive supply voltage; and
    a biasing stage having a plurality of transistors arranged and coupled together to receive the applied core voltage from the single transistor and then selectively activate the single transistor by applying a feedback signal to the single gate of the single transistor based on sensing a changing voltage level of the applied core voltage, wherein the biasing stage uses a leakage current drawn from a settled voltage level of the core supply voltage as a reference current to bias the biasing stage itself for regulating the applied core voltage without comparing the applied core voltage with an additional reference voltage.

2. The device of claim 1, wherein the only one power gating switch is adapted to pass the core supply voltage to the memory array as the applied core voltage when activated, and wherein the device only uses the applied core voltage for one or more of the memory array, the only one power gating switch and the biasing stage.

3. The device of claim 1, wherein the device comprises an intrinsic capacitance for loop stability of the device.

4. The device of claim 1, wherein the biasing stage activates the only one power gating switch by providing the feedback signal as a voltage biasing signal to the single gate of the single transistor.

5. The device of claim 4, wherein:
    a biasing voltage level of the voltage biasing signal is selectively increased and applied to the single gate of the single transistor based on sensing an increase in the changing voltage level of the applied core voltage, and
    the biasing voltage level of the voltage biasing signal is selectively decreased and applied to the single gate of the single transistor based on sensing a decrease in the changing voltage level of the applied core voltage.

6. The device of claim 1, wherein the only one power gating switch comprises a header device that is coupled between the positive supply voltage and the memory array.

7. The device of claim 6, wherein the header device comprises only one p-type power gating transistor with only the single gate that is selectively activated with the feedback signal provided by the biasing stage.

8. The device of claim 7, wherein the only one power gating switch is adapted to pass the positive supply voltage to the memory array as the applied core voltage when activated, and wherein the biasing stage comprises a plurality of p-type transistors that are different than the plurality of transistors and that are arranged and coupled together to receive the positive supply voltage from the p-type power gating transistor and to selectively apply the feedback signal to a gate of the p-type power gating transistor based on sensing the changing voltage level of the positive supply voltage.

9. A device comprising:
a memory array that operates with an applied core voltage;
a power gating circuit having only one power gating switch with a single transistor coupled in series between a core supply voltage and the memory array, wherein the single transistor receives the core supply voltage and provides the applied core voltage to the memory array, and wherein the single transistor has a single gate, and wherein the core supply voltage refers to a negative supply voltage; and
a biasing stage having a plurality of transistors arranged and coupled together to receive the applied core voltage from the single transistor and then selectively activate the single transistor by applying a feedback signal to the single gate of the single transistor based on sensing a changing voltage level of the applied core voltage,
wherein the only one power gating switch comprises a footer device that is coupled between the negative supply voltage and the memory array, and
wherein the biasing stage uses a leakage current drawn from a settled voltage level of the core supply voltage as a reference current to bias the biasing stage itself for regulating the applied core voltage without comparing the applied core voltage with an additional reference voltage.

10. The device of claim 9, wherein the only one power gating switch is adapted to pass the negative supply voltage to the memory array as the applied core voltage when activated, and wherein the footer device comprises only one n-type power gating transistor with only the single gate that is selectively activated with the feedback signal provided by the biasing stage.

11. A system, comprising:
a memory array coupled between a first voltage and a second voltage;
a header device having a single power gating switch with only one transistor coupled in series between the first voltage and the memory array, wherein the only one transistor receives the first voltage as a positive supply voltage and provides an applied first voltage to the memory array based on the positive supply voltage, and wherein the only one transistor has a single gate;
a footer device that power gates the second voltage to the memory array as an applied second voltage;
a central biasing header stage with a plurality of transistors that are arranged and coupled together to receive the applied first voltage from the only one transistor and then selectively activate the header device with a negative voltage biasing signal by applying a feedback signal to the single gate of the single transistor based on sensing a changing voltage level of the applied first voltage; and
a central biasing footer stage that selectively activates the footer device based on sensing a changing voltage level of the applied second voltage,
wherein the central biasing header stage uses a leakage current drawn from a settled voltage level of the core supply voltage as a reference current to bias the central biasing header stage itself for regulating the applied core voltage without comparing the applied core voltage with an additional reference voltage.

12. The system of claim 11, wherein the first voltage comprises a core supply voltage, the applied first voltage comprises an applied core supply voltage, and wherein the second voltage comprises a negative supply voltage.

13. The system of claim 12, wherein the header device passes the core supply voltage to the memory array as the applied core supply voltage when activated, and wherein the footer device passes the negative supply voltage to the memory array when activated.

14. The system of claim 11, wherein:
the only one single transistor of the header device comprises only one p-type header transistor having the single gate,
the central biasing header stage selectively activates the header device by applying the negative voltage biasing signal to only the single gate of the only one p-type header transistor,
the footer device comprises an n-type footer transistor, and
the central biasing footer stage selectively activates the footer device by applying the positive voltage biasing signal to a gate of the n-type footer transistor.

15. The system of claim 14, wherein:
when activated, the only one transistor passes the first voltage to the memory array as the applied first voltage based on the positive supply voltage,
a voltage level of the negative voltage biasing signal is selectively increased and applied to the single gate of the only one p-type header transistor based on sensing an increase in the changing voltage level of the first voltage, and
the voltage level of the negative voltage biasing signal is selectively decreased and applied to the single gate of the only one p-type header transistor based on sensing a decrease in the changing voltage level of the first voltage.

16. The system of claim 14, wherein:
a voltage level of the positive voltage biasing signal is selectively increased and applied to the gate of the n-type footer transistor based on sensing an increase in the changing voltage level of the applied second voltage, and
the voltage level of the positive voltage biasing signal is selectively decreased and applied to the gate of the n-type footer transistor based on sensing a decrease in the changing voltage level of the applied second voltage.

17. A method, comprising:
providing a core supply voltage to only one power gating transistor for operating a memory array, wherein the only one power gating transistor is coupled in series between the core supply voltage and the memory array, wherein the core supply voltage refers to a positive supply voltage;

providing an applied core voltage to the memory array and a biasing stage by activating the only one power gating transistor with the biasing stage by way of a plurality of transistors arranged and coupled together to receive the applied core voltage from the only one power gating transistor, wherein the applied core voltage refers to a positive applied core voltage;

power gating the core supply voltage with the biasing stage so as to provide the applied core voltage to the memory array with the only one power gating transistor, wherein the only one power gating transistor has only one gate; and selectively activating the only one power gating transistor with a feedback signal applied by the biasing stage by way of the plurality of transistors to the only one gate of the only one power gating transistor based on sensing a changing voltage level of the applied core voltage, wherein the biasing stage uses a leakage current drawn from a settled voltage level of the core supply voltage as a reference current to bias the biasing stage itself for regulating the applied core voltage without comparing the applied core voltage with an additional reference voltage.

18. The method of claim 17, wherein:

the only one power gating transistor passes the core supply voltage as the positive applied core voltage to the memory array when activated, the only one power gating transistor comprises a power gating switch, and the biasing stage is used to selectively activate the power gating switch by providing the feedback signal as a voltage biasing signal to the only one gate of the only one power gating transistor.

19. The method of claim 18, wherein:

a biasing voltage level of the voltage biasing signal is selectively increased and applied to the only one gate of the only one power gating transistor based on sensing an increase in the changing voltage level of the applied core voltage, and the biasing voltage level of the voltage biasing signal is selectively decreased and applied to the only one gate of the only one power gating transistor based on sensing a decrease in the changing voltage level of the applied core voltage.

* * * * *